(12) United States Patent
Srivastava et al.

(10) Patent No.: US 10,714,380 B2
(45) Date of Patent: Jul. 14, 2020

(54) METHOD OF FORMING SMOOTH SIDEWALL STRUCTURES USING SPACER MATERIALS

(71) Applicant: GLOBALFOUNDRIES INC., Grand Cayman (KY)

(72) Inventors: Ravi P. Srivastava, Clifton Park, NY (US); Sipeng Gu, Clifton Park, NY (US); Sunil K. Singh, Mechanicville, NY (US); Xinyuan Dou, Clifton Park, NY (US); Akshey Sehgal, Malta, NY (US); Zhiguo Sun, Halfmoon, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/171,477

(22) Filed: Oct. 26, 2018

(65) Prior Publication Data
US 2020/0135545 A1 Apr. 30, 2020

(51) Int. Cl.
*H01L 21/768* (2006.01)
*H01L 21/02* (2006.01)

(52) U.S. Cl.
CPC .... *H01L 21/76814* (2013.01); *H01L 21/0228* (2013.01); *H01L 21/02203* (2013.01); *H01L 21/76825* (2013.01)

(58) Field of Classification Search
CPC ......... H01L 21/76814; H01L 21/02203; H01L 21/0228; H01L 21/76825
See application file for complete search history.

(56) References Cited

U.S. PATENT DOCUMENTS

| | | | |
|---|---|---|---|
| 7,466,027 B2 | 12/2008 | Ko et al. | |
| 7,838,428 B2 | 11/2010 | Chen et al. | |
| 8,501,637 B2 | 8/2013 | Matero et al. | |
| 9,362,179 B1* | 6/2016 | Cheng | H01L 21/82382 |
| 2006/0172530 A1 | 8/2006 | Cheng et al. | |
| 2007/0082437 A1* | 4/2007 | Cheng | H01L 29/66795 |
| | | | 438/197 |
| 2016/0204245 A1* | 7/2016 | Jangjian | H01L 21/0228 |
| | | | 257/401 |
| 2018/0308695 A1* | 10/2018 | LaVoie | H01L 21/31122 |

* cited by examiner

*Primary Examiner* — Michael Jung
(74) *Attorney, Agent, or Firm* — Anthony Canale; Andrew M. Calderon; Roberts Calderon Safran & Cole, P.C.

(57) ABSTRACT

The present disclosure generally relates to semiconductor structures and, more particularly, to smooth sidewall structures and methods of manufacture. The method includes: forming a plurality of mandrel structures; forming a first spacer material on each of the plurality of mandrel structures; forming a second spacer material over the first spacer material; and removing the first spacer material and the plurality of mandrel structures to form a sidewall structure having a sidewall smoothness greater than the plurality of mandrel structures.

20 Claims, 2 Drawing Sheets

METHOD OF FORMING SMOOTH SIDEWALL STRUCTURES USING SPACER MATERIALS

FIELD OF THE INVENTION

The present disclosure generally relates to semiconductor structures and, more particularly, to smooth sidewall structures and methods of manufacture.

BACKGROUND

As semiconductor processes continue to scale downwards, e.g., shrink, the desired spacing between features or pitch also becomes smaller. To this end, in the smaller technology nodes it becomes ever more difficult to fabricate front end of line (FEOL), back end of line (BEOL) and middle of line (MOL) features due to the critical dimension (CD) scaling and process capabilities.

For example, as the geometry of devices continuously shrinks, the influence of line edge roughness (LER) and line width roughness (LWR) on device performance becomes more and more significant. As an example, a relatively high LER can lead to degradation and poor fill capabilities, resulting in challenges for integrating certain materials and processes.

SUMMARY

In an aspect of the disclosure, a method comprises: forming a plurality of mandrel structures; forming a first spacer material on each of the plurality of mandrel structures; forming a second spacer material over the first spacer material; and removing the first spacer material and the plurality of mandrel structures to form a sidewall structure having a sidewall smoothness greater than the plurality of mandrel structures.

In an aspect of the disclosure, a method comprises: forming a plurality of mandrel structures having rough surfaces; depositing an aluminum film on the mandrel structures; etching the aluminum film to form spacer structures; depositing a spacer film over the mandrel structures and the spacer structures; etching the spacer film to form smooth sidewall structures; and removing the mandrel structures and the aluminum film, leaving the spacer film as a patterned shape.

In an aspect of the disclosure, a method comprises: forming a mandrel from a plurality of stacked materials; forming a carbon film on the mandrel; anisotropically etching the carbon film to expose the mandrel; depositing a spacer material on the carbon film and the exposed mandrel, the spacer material being different than the carbon film; anisotropically etching the spacer material to expose the mandrel and the carbon film; and removing both the mandrel and the carbon film, leaving the anisotropically etched spacer material which has a sidewall smoothness different than the mandrel.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to smooth sidewall structures and methods of manufacture. In embodiments, the processes and structures described herein provide improvements for shrinking technology nodes with respect to line edge roughness (LER) and line width roughness (LWR) issues. More specifically, the structures and processes described herein allow for the formation of smooth sidewall structures by deposition processes as opposed to patterning processes. Advantageously, by having smooth sidewall structures, issues such as time-dependent dielectric breakdown (TDDB) and poor metal gap fill capabilities can be alleviated.

Advantages of the smooth sidewall structures and processes described herein include improved device performance through improved LER/LWR, resulting in reduced leakage, improved TDDB performance and improved resistance-capacitance. Additionally, the smooth sidewall structures can improve yield by preventing inter metal shorts, such as preventing line merging. Accordingly, the structures and processes described herein allow for an improvement in the process margin of sidewall assisted double patterning (SADP) and sidewall assisted quadruple patterning (SAQP) processes with and without extreme ultraviolet (EUV) lithography. In this way, devices integrating certain materials and processes, e.g., porous low-k materials and ultra-thin barrier processes, can be fabricated in advanced technology nodes such as 7 nm and beyond.

In an example embodiment, mandrels having LER are covered with a film, which is then etched to form spacer structures. The spacer structures and mandrels are then covered with another film to form smooth sidewall structures. In further embodiments, the mandrels and the spacer structures are etched, resulting in smooth sidewall structures. In this way, the smooth sidewall structures can serve as spacers or mandrels in a shrinking critical dimension (CD).

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii)

applying a patterned mask on top of the films by photolithographic imaging, and (iii) etching the films selectively to the mask.

Figure 1:
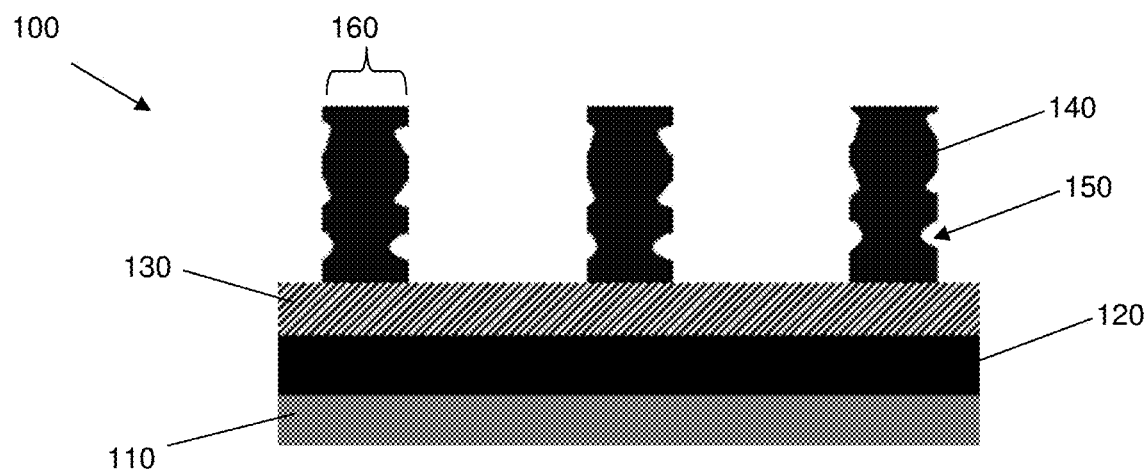
FIG. 1 shows mandrel structures, amongst other features, and respective fabrication processes in accordance with aspects of the present disclosure.

FIG. 1 shows an incoming structure and respective fabrication processes in accordance with aspects of the present disclosure. More specifically, FIG. 1 shows a structure 100, which comprises an interlevel dielectric (ILD) 110 composed of a suitable oxide material. The structure 100 also includes a metal layer 120 over the ILD 110. In embodiments, the metal layer can be composed of TiN, amongst other metals. Further, the metal layer 120 is deposited over the ILD 110 by conventional deposition processes, e.g., chemical vapor deposition (CVD) processes, followed by a chemical mechanical planarization (CMP) process. A nitride layer 130 is fabricated over the ILD 110 and the metal layer 120. In embodiments, the nitride layer 130 can be any suitable nitride material, e.g., SiN, amongst other examples. The nitride layer 130 is deposited by a CVD process, followed by a CMP process.

Mandrel structures 140 are formed directly on the nitride layer 130 and over the ILD 110 and the metal layer 120. In embodiments, the mandrel structures 140 are composed of a suitable mandrel material, e.g., amorphous Si, Si, or resist material (SOH), amongst other examples. In further embodiments, the mandrel material is a plurality of stacked materials, with a mandrel structure 140 formed from the plurality of stacked materials. The mandrel material is deposited on the nitride layer 130 using conventional CVD processes. Once deposited, the mandrel material is then patterned to form the mandrel structures 140, e.g., using sidewall assisted double patterning (SADP) or sidewall assisted quadruple patterning (SAQP) processes, with or without extreme ultraviolet (EUV) lithography.

FIG. 1 illustrates the mandrel structures 140 having a line edge roughness (LER) 150 and a line width roughness (LWR) 160, which occur from the patterning process of the mandrel material to form the mandrel structures 140. More specifically, for LER 150, surfaces of the mandrel structures 140, e.g., side surfaces, are rough and uneven (not smooth). For LWR 160, the roughness in the surfaces caused by the LER 150 also causes the widths of the mandrel structures 140 to be uneven. In this way, the mandrel structures 140 can also have a LWR 160 in addition to LER 150. The unevenness and roughness shown as LER 150 and LWR 160 can cause line merging, which degrades device performance and reliability. As an example, line merging can cause electrical issues such as contacts touching and causing shorts, amongst other issues.

In embodiments, the mandrel structures 140 can have a height in a range of about 20 nm to 30 nm, and a width in a range of about 15 nm to 40 nm. Further, the LER 150 can have a roughness resulting in a difference in a range of about 2 nm to 3 nm of a sidewall of the mandrel structure 140. In embodiments, the thickness ranges of the LER 150 and LWR 160, depending on the technology node, can be more or less prevalent because of the size of the mandrel structures 140. For example, as the mandrel structures 140 are reduced in size to meet the needs of shrinking technology nodes, e.g., 7 nm, LER 150 and LWR 160 become more prevalent, e.g., LER 150 having a roughness greater than 2 nm to 3 nm. Alternatively, as the mandrel structures 140 are increased in size, LER 150 and LWR 160 can become less prevalent, e.g., LER 150 having a thickness less than 2 nm to 3 nm.

Figure 2:
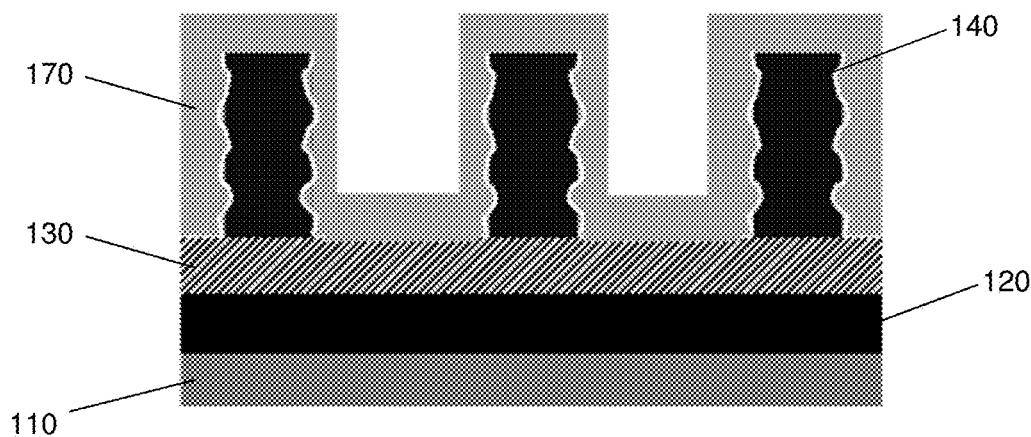
FIG. 2 shows a film layer, amongst other features, and respective fabrication processes in accordance with aspects of the present disclosure.

FIG. 2 illustrates a first spacer film 170 deposited over the mandrel structures 140 and the nitride layer 130. More specifically, the first spacer film 170 is deposited directly on the uneven and rough surfaces of the mandrel structures 140 caused by the LER 150, in addition to top surfaces of the mandrel structures 140 and the nitride layer 130. In embodiments, the first spacer film 170 can be deposited by atomic layer deposition (ALD) or plasma-enhanced chemical vapor deposition (PECVD), for example, which will provide a complete coverage of the LER 150 and LWR 160.

The first spacer film 170 can be a carbon based film or can be an aluminum based film, e.g., topaz, amongst other materials. In this way, the aluminum film is comprised of a topaz material. Benefits of topaz include about 100% coverage on both dense and isolated structures 140 (also referred to as mandrel structures). Other benefits of topaz include a greater gap filling capability, zero micro-loading, being strippable in $O_2$ or $H_2$ plasma, an improved process capability to tune step coverage and improved LER. In this way, the first spacer film 170 is composed of a carbon film. Alternatively, the first spacer film 170 is composed of topaz.

The first spacer film 170 is deposited to have a thickness to ensure that the LER 150 is fully covered by the first spacer film 170. More specifically, the first spacer film 170 is a spacer deposited to a thickness that completely covers the line edge roughness 150 of the plurality of mandrel structures 140. In embodiments, the first spacer 170 is deposited to a thickness of about 2 nm to 3 nm, and preferably to a thickness greater than 2 nm to 3 nm. Specifically, the film 170 has a thickness greater than the roughness of the LER 150. In this way, the first spacer film 170 which can be carbon or the aluminum is deposited to have a thickness greater than 2 nm to 3 nm. In embodiments, the film should be deposited to a thickness that would not result in any pinch-off phenomenon.

Figure 3:
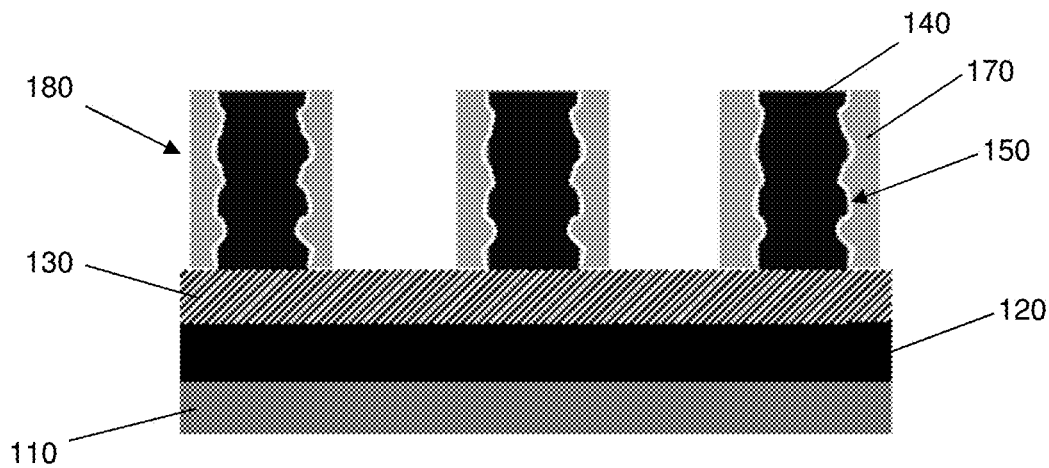
FIG. 3 shows spacer structures, amongst other features, and respective fabrication processes in accordance with aspects of the present disclosure.

FIG. 3 illustrates spacer structures 180 formed by an etching of the film 170. The spacer structures 180 cover the roughness of the LER 150, thereby improving the LER 150 and LWR 160. In embodiments, the spacer structures 180 allow for an improvement of approximately 25% for LER 150, and an improvement of approximately 27% for LWR 160. The first spacer film 170 is etched away from the top surfaces of the mandrel structures 140 and top surfaces of the nitride layer 130 by an anisotropic etching process. In this way, a method includes anisotropically etching a carbon film 170, to expose the mandrel structure 140. In embodiments, the anisotropic etch can cause the top corners of the spacers 180 to be rounded, as opposed to square-shaped.

Figure 4:
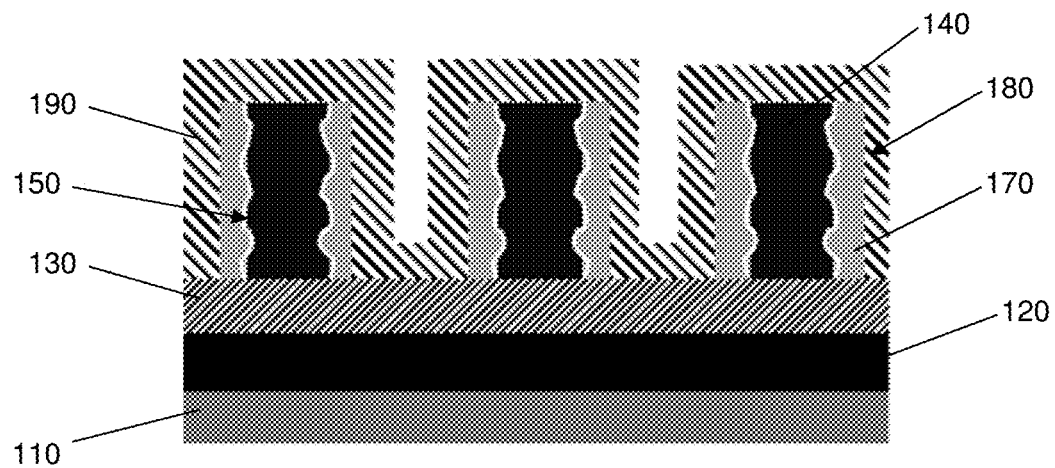
FIG. 4 shows a spacer film, amongst other features, and respective fabrication processes in accordance with aspects of the present disclosure.

FIG. 4 illustrates the deposition of second spacer film 190 over the mandrel structures 140 and the spacer structures 180. In this way, a method includes depositing a spacer material to form the second spacer film 190, on the first spacer film 170 (e.g., carbon), and the exposed mandrel structure 140, with the second spacer film 190 being different than the first spacer film 170. In embodiments, the second spacer film 190 is a spacer deposited by an ALD process. The second spacer 190 comprises one of a metal material, a nitride material, or a dielectric material, e.g., an oxide material, amongst other examples. In this way, the plurality of mandrel structures 140 are a first material different than the first spacer film 170 and the second spacer film 190.

In embodiments, the material of the second spacer film 190 is selected based on an etch selectivity different than the nitride layer 130. More specifically, the second spacer film 190 will have an etch selectivity that is susceptible to a specific etching process, with the etching process stopping on the nitride layer 130 because of the different materials. Further, the carbon film 170 has an etch selectivity with respect to the second spacer film 190. The second spacer film 190 is deposited to have a thickness of any desirable amount which does not create a pinch-off phenomena between the mandrel structures 140. As an example, the second spacer film 190 can have a thickness of about 10-15 nm, amongst other examples.

Figure 5:
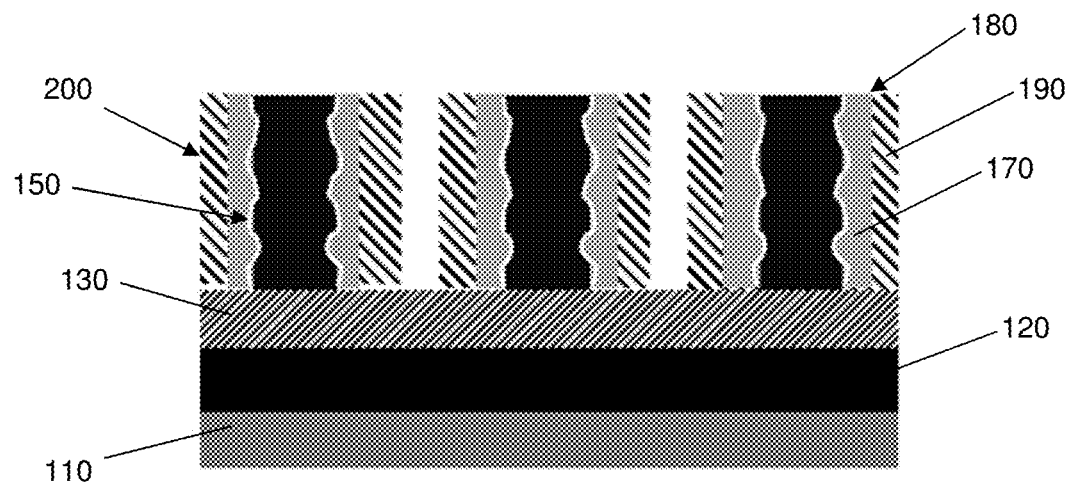
FIG. 5 shows an etched spacer film, amongst other features, and respective fabrication processes in accordance with aspects of the present disclosure.

FIG. 5 illustrates sidewall structures 200 with a smooth surface. The sidewall structures 200 are formed by etching of the second spacer film 190. Specifically, the second spacer film 190 is etched from the top surfaces of the mandrel structures 140, top surfaces of the nitride layer 130 and top surfaces of the spacer structures 180 by an anisotropic etching process. In this way, the forming of the first spacer material and the second spacer material comprises a deposition process followed by an anisotropic etching process to expose the plurality of mandrel structures 140. More specifically, the etching of the first spacer film 170 (aluminum) to form spacer structures 180 and the etching of the second spacer film 190 comprises an anisotropic etching process to expose the mandrel structures 140 for subsequent removal. In embodiments, the anisotropic etch can cause the top corners of the spacers 200 to be rounded, as opposed to square-shaped.

By having an adjustable thickness, the sidewall structures 200 are tunable. In this way, the width of the sidewall structures 200 can be tuned by increasing or decreasing the amount of spacer film 190 deposited. In embodiments, the sidewall structures 200 cover the sidewalls of the spacer structures 180. In embodiments, the sidewall structures 200 further reduce the roughness from the LER 150. In this way, the anisotropically etched sidewall structures 200 have a sidewall smoothness different than the mandrel structure 140.

Figure 6:
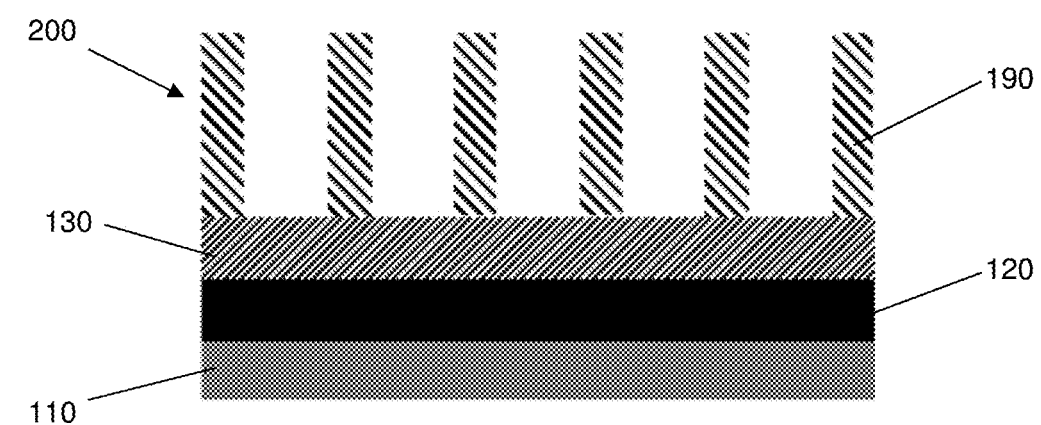
FIG. 6 shows smooth sidewall structures, amongst other features, and respective fabrication processes in accordance with aspects of the present disclosure.

FIG. 6 illustrates the stripping of the mandrel structures 140 and the spacer structures 180, leaving sidewall structures 200. In embodiments, the mandrel structures 140 and the spacer structures 180 are etched using a conventional etching process, e.g., reactive ion etching (RIE). In this way, the structures and processes described herein provide a method for forming a plurality of mandrel structures 140, forming a first spacer film 170, on each of the plurality of mandrel structures 140, forming the second spacer film 190, over the first spacer film 170, and removing the first spacer film 170, and the plurality of mandrel structures 140 to form a sidewall structure 200 having a sidewall smoothness greater than the plurality of mandrel structures 140. More specifically, the structures and processes described herein provide for a method for forming a plurality of mandrel structures 140 having rough surfaces from the LER 150, depositing an first spacer film (aluminum) 170, on the mandrel structures 140, etching the first spacer film 170, to form spacer structures 180, depositing the second spacer film 190 over the mandrel structures 140 and the spacer structures 180, etching the second spacer film 190 to form smooth sidewall structures 200, and removing the mandrel structures 140 and the aluminum film 170, leaving the second spacer film 190, as a patterned shape in the form of the sidewall structures 200.

In further embodiments, the RIE etching process occurs with selective chemistries to prevent etching of the nitride layer 130 and the material of the sidewall structures 200. As shown in FIG. 6, the sidewall structures 200 have both side surfaces relatively smooth because of the smoothness provided by a deposition process of the spacer structures 180 compared to a patterning process. More specifically, the anisotropically etched sidewall structures 200 have a sidewall smoothness greater than a sidewall of the mandrel structure 140. Accordingly, the smoothness of the sidewall structures 200 reduces the effects of LER and LWR. The sidewall structures 200 can be used as spacer structures to define the critical dimension (CD), or can be used as mandrel structures for further shrinking CD.

It should now be understood that the processes and resultant structures described herein will serve to alleviate issues caused by line edge roughness (LER) and line width roughness (LWR) in smaller technology nodes. Specifically, by implementing deposition processes as opposed to patterning processes, issues caused by LER and LWR can be reduced or completely avoided. Advantageously, by having smooth sidewall structures, device performance is improved because of improved LER/LWR and improved metal gap fill capabilities, resulting in reduced leakage, improved time-dependent dielectric breakdown (TDDB) performance and improved resistance-capacitance. Additionally, the smooth sidewall structures provide an improved yield by preventing inter-metal shorts from line merging, which is caused by LER and LWR issues. Accordingly, the structures and processes described herein allow for a significant improvement in the process margin of sidewall assisted double patterning (SADP) and sidewall assisted quadruple patterning (SAQP) processes with and without extreme ultraviolet (EUV) lithography. In this way, devices integrating certain materials and processes, e.g., porous low-k material and ultra-thin barrier processes, can be fabricated in advanced technology nodes such as 7 nm and beyond.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A method comprising:
    forming mandrel structures;
    forming a first spacer material on each of the mandrel structures;
    forming a second spacer material over the first spacer material; and removing the first spacer material and the mandrel structures to form a sidewall structure having a sidewall smoothness greater than a sidewall smoothness of the mandrel structures, wherein the forming the first spacer material and the second spacer material comprises a deposition process followed by an anisotropic etching process to expose the mandrel structures.

2. The method of claim 1, wherein the mandrel structures are a first material different than the first spacer material and the second spacer material.

3. The method of claim 1, wherein the mandrel structures have a line edge roughness.

4. The method of claim 3, wherein the first spacer material is deposited to a thickness that completely covers the line edge roughness of the mandrel structures.

5. The method of claim 4, wherein the first spacer material is deposited to a thickness of 2 nm to 3 nm.

6. The method of claim 1, wherein the mandrels structures have a line width roughness.

7. The method of claim 1, wherein the first spacer film is composed of a carbon film.

8. The method of claim 1, wherein the first spacer material is deposited to have a thickness greater than 2 nm to 3 nm.

9. The method of claim 8, wherein the second spacer material is deposited to have a thickness of 10 nm to 15 nm.

10. The method of claim 1, wherein the mandrels are comprised of silicon.

11. The method of claim 1, wherein each of the mandrels has a height between 20 nm-30 nm and a width between 15 nm-40 nm.

12. A method comprising:
forming mandrel structures;
forming a first spacer material on each of the mandrel structures;
forming a second spacer material over the first spacer material; and
removing the first spacer material and the mandrel structures to form a sidewall structure having a sidewall smoothness greater than a sidewall smoothness of the mandrel structures,
wherein the first spacer film is composed of topaz.

13. The method of claim 12, wherein the second spacer film comprises one of a metal material, a nitride material, or a dielectric material.

14. A method comprising:
forming a mandrel structures having rough surfaces;
depositing an aluminum film on the mandrel structures;
etching the aluminum film to form spacer structures;
depositing a spacer film over the mandrel structures and the spacer structures;
etching the spacer film to form smooth sidewall structures; and
removing the mandrel structures and the aluminum film, leaving the spacer film as a patterned shape.

15. The method of claim 14, wherein the rough surfaces are a line edge roughness.

16. The method of claim 14, wherein the mandrel structures have a line width roughness.

17. The method of claim 14, wherein the aluminum film is deposited to have a thickness greater than 2 nm to 3 nm.

18. The method of claim 14, wherein the aluminum film is comprised a topaz material.

19. The method of claim 14, wherein the etching of the aluminum film to form spacer structures and the etching of the spacer film comprises an anisotropic etching process to expose the mandrel structures for subsequent removal.

20. The method of claim 14, wherein the mandrels are comprised of a material different than the aluminum film of the spacer structures and the material comprising the spacer film.

* * * * *